US012610825B2

(12) United States Patent
Jeon et al.

(10) Patent No.: US 12,610,825 B2
(45) Date of Patent: Apr. 21, 2026

(54) SEMICONDUCTOR DEVICE

(71) Applicant: SAMSUNG ELECTRONICS CO., LTD., Suwon-si (KR)

(72) Inventors: Junsu Jeon, Hwaseong-si (KR); Subin Kim, Hwaseong-si (KR); Byungmoo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 639 days.

(21) Appl. No.: 17/720,435

(22) Filed: Apr. 14, 2022

(65) Prior Publication Data

US 2022/0344285 A1     Oct. 27, 2022

(30) Foreign Application Priority Data

Apr. 27, 2021   (KR) ........................ 10-2021-0054638
Jun. 29, 2021   (KR) ........................ 10-2021-0084748

(51) Int. Cl.
| *H01L 23/60* | (2006.01) |
| *H01L 23/00* | (2006.01) |
| *H01L 23/58* | (2006.01) |

(52) U.S. Cl.
CPC ........... *H01L 23/60* (2013.01); *H01L 23/562* (2013.01); *H01L 23/564* (2013.01); *H01L 23/585* (2013.01)

(58) Field of Classification Search
None
See application file for complete search history.

(56) References Cited

U.S. PATENT DOCUMENTS

| 7,256,474 | B2 | 8/2007 | Wakayama et al. |
| 7,728,418 | B2 | 6/2010 | Nomura et al. |
| 8,264,064 | B2 | 9/2012 | Watanabe |
| 9,627,332 | B1 * | 4/2017 | Liang .................... H01L 23/585 |
| 9,679,896 | B2 | 6/2017 | Yoon et al. |
| 10,438,902 | B2 | 10/2019 | McGahay et al. |
| 2005/0087878 | A1 | 4/2005 | Uesugi et al. |
| 2007/0044057 | A1 | 2/2007 | Kitani et al. |
| 2013/0023091 | A1 * | 1/2013 | Leal ........................ H01L 24/03 |
| | | | 257/E21.602 |
| 2019/0067216 | A1 * | 2/2019 | Zhu ........................ H01L 23/585 |

FOREIGN PATENT DOCUMENTS

| JP | 2006-303073 | 11/2006 |
| KR | 10-2001-0064058 | 7/2001 |
| KR | 10-2016-0072965 A | 6/2016 |
| TW | 200839938 A | 10/2008 |

OTHER PUBLICATIONS

1st OA issued in corresponding IN Patent Application No. 202244024371 on Sep. 24, 2024.

* cited by examiner

*Primary Examiner* — Brent A. Fairbanks
*Assistant Examiner* — Derek L Nielsen
(74) *Attorney, Agent, or Firm* — Morgan, Lewis & Bockius LLP

(57) ABSTRACT

A semiconductor device includes a semiconductor substrate including a main chip region, a guard ring surrounding the main chip region, a moisture-proof ring surrounding the guard ring, an electrode structure in contact with the semiconductor substrate in the main chip region, and at least one metal pattern structure extending from the electrode structure to the moisture-proof ring. The at least one metal pattern structure is a connection line that grounds the moisture-proof ring.

8 Claims, 17 Drawing Sheets

100

200

101
120
130

C          C'

150

D1
D3 ⊙ → D2

1100

1150

1140
INTERFACE

1130
MEMORY

1120
INPUT/OUTPUT
DEVICE

1110
CONTROLLER

SEMICONDUCTOR DEVICE

CROSS-REFERENCE TO RELATED APPLICATIONS

This application is based on and claims priority under 35 U.S.C. § 119 to Korean Patent Application Nos. 10-2021-0054638, filed on Apr. 27, 2021, and 10-2021-0084748, filed on Jun. 29, 2021, in the Korean Intellectual Property Office, the disclosures of which are incorporated by reference herein in their entirety.

TECHNICAL FIELD

Embodiments of the inventive concept relate to a semiconductor device, and more particularly, to a semiconductor device including a guard ring and a moisture-proof ring.

DISCUSSION OF RELATED ART

Generally, semiconductor devices are manufactured through a die sawing process of cutting a wafer on which an integrated circuit device is formed. During the die sawing process, a sawing blade cuts a wafer along a scribe lane region, and as a result, a plurality of semiconductor devices are physically separated from one another.

SUMMARY

An object of embodiments of the inventive concept is to prevent or reduce a risk of damage to an integrated circuit device of a semiconductor device from an arcing phenomenon caused by charged particles due to plasma used in an etching process through the semiconductor device, using a metal pattern structure electrically connected to a moisture-proof ring as a ground connection line. However, objects of embodiments of the inventive concept are not limited thereto.

A semiconductor device according to an embodiment of the inventive concept includes a semiconductor substrate including a main chip region, a guard ring surrounding the main chip region, a moisture-proof ring surrounding the guard ring, an electrode structure in contact with the semiconductor substrate in the main chip region, and at least one metal pattern structure extending from the electrode structure to the moisture-proof ring. The at least one metal pattern structure is a connection line that grounds the moisture-proof ring.

A semiconductor device according to an embodiment of the inventive concept includes a semiconductor substrate including a main chip region and a sealing region surrounding the main chip region, a guard ring surrounding the main chip region in the sealing region, a moisture-proof ring surrounding the guard ring in the sealing region, and at least one metal pattern structure extending from the moisture-proof ring in a direction crossing the sealing region. The at least one metal pattern structure is a connection line that grounds the moisture-proof ring.

A semiconductor device according to an embodiment of the inventive concept includes a semiconductor substrate including a main chip region and a sealing region surrounding the main chip region, an electrode structure in contact with the semiconductor substrate in the main chip region, a guard ring surrounding the main chip region in the sealing region, a moisture-proof ring surrounding the guard ring in the sealing region, at least one first metal pattern structure extending from the electrode structure to the moisture-proof ring in a horizontal direction, and at least one second metal pattern structure extending from the moisture-proof ring in the horizontal direction crossing the sealing region. The at least one first and second metal pattern structures are connection lines that ground the moisture-proof ring.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
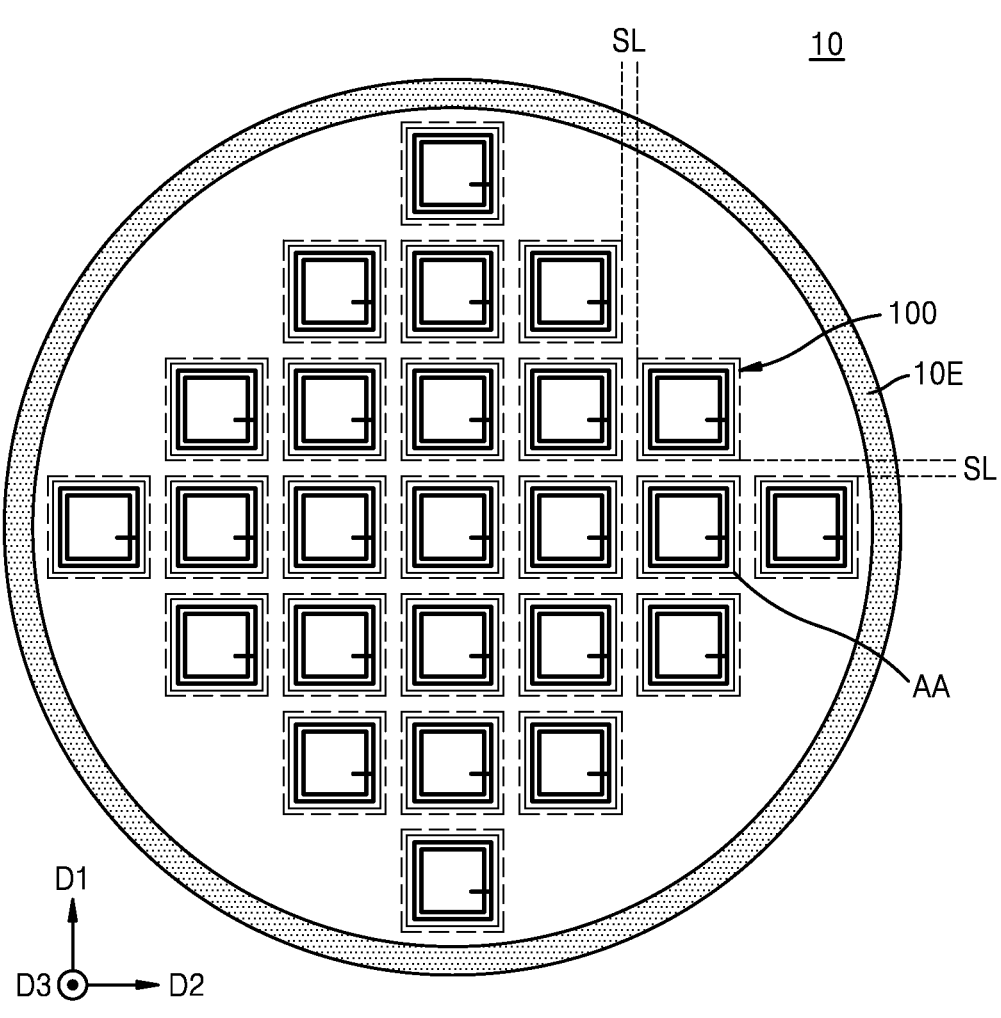
FIG. 1 is a schematic plan view showing a wafer including a semiconductor device, according to an embodiment of the inventive concept.

Embodiments of the inventive concept will be described more fully hereinafter with reference to the accompanying drawings. Like reference numerals may refer to like elements throughout the accompanying drawings.

Herein, when two or more elements or values are described as being substantially the same as or substantially equal to each other, it is to be understood that the elements or values are identical to each other, the elements or values are equal to each other within a measurement error, or if measurably unequal, are close enough in value to be functionally equal to each other as would be understood by a person having ordinary skill in the art. Further, when elements are described as being substantially coplanar with one another, it is to be understood that elements are exactly coplanar with one another, or almost coplanar with one another (e.g., within a measurement error), as would be understood by a person having ordinary skill in the art. Further when two components or directions are described as extending substantially parallel or perpendicular to each other, the two components or directions extend exactly parallel or perpendicular to each other, or extend approximately parallel or perpendicular to each other as would be understood by a person having ordinary skill in the art (e.g., within a measurement error). Other uses of the term "substantially" should be interpreted in a like fashion.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Figure 2:
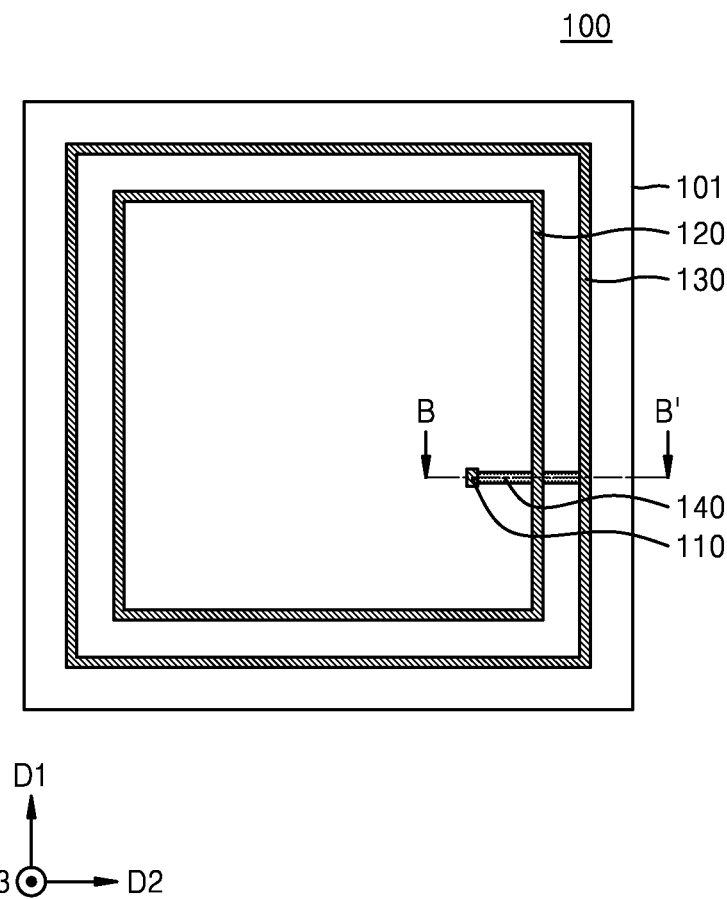
FIG. 2 is a schematic plan view of the semiconductor device of FIG. 1 showing an enlarged portion AA of FIG. 1, according to an embodiment of the inventive concept.
Figure 3:
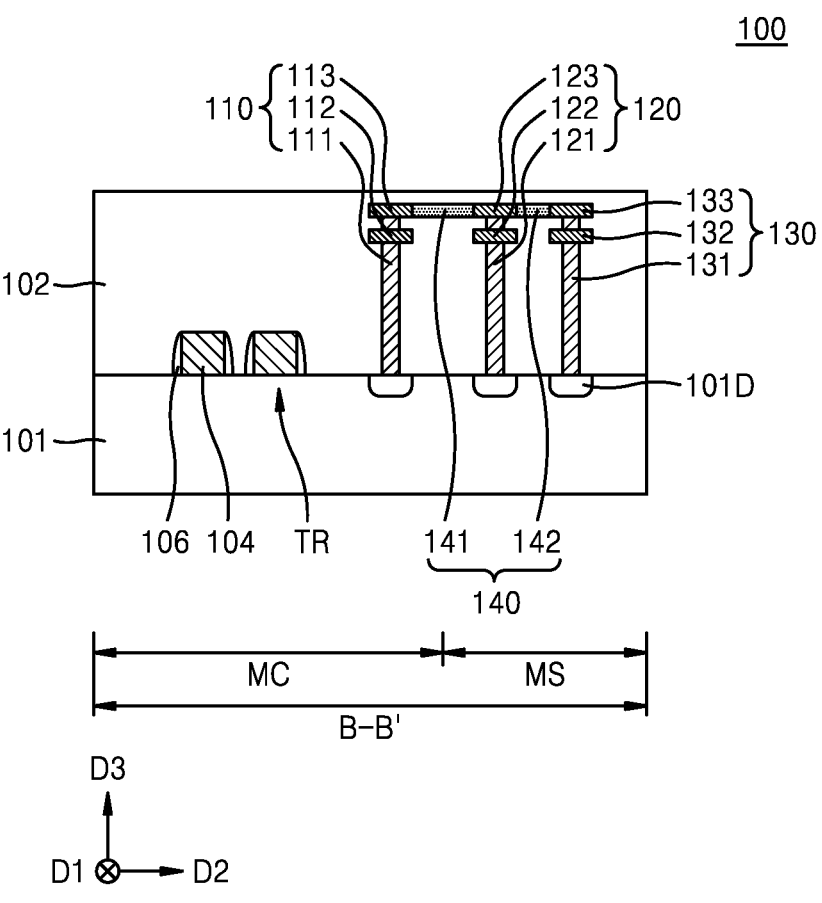
FIG. 3 is a schematic vertical cross-sectional view of the semiconductor device of FIG. 1 cut along line B-B' of FIG. 2, according to an embodiment of the inventive concept.
Figure 4:
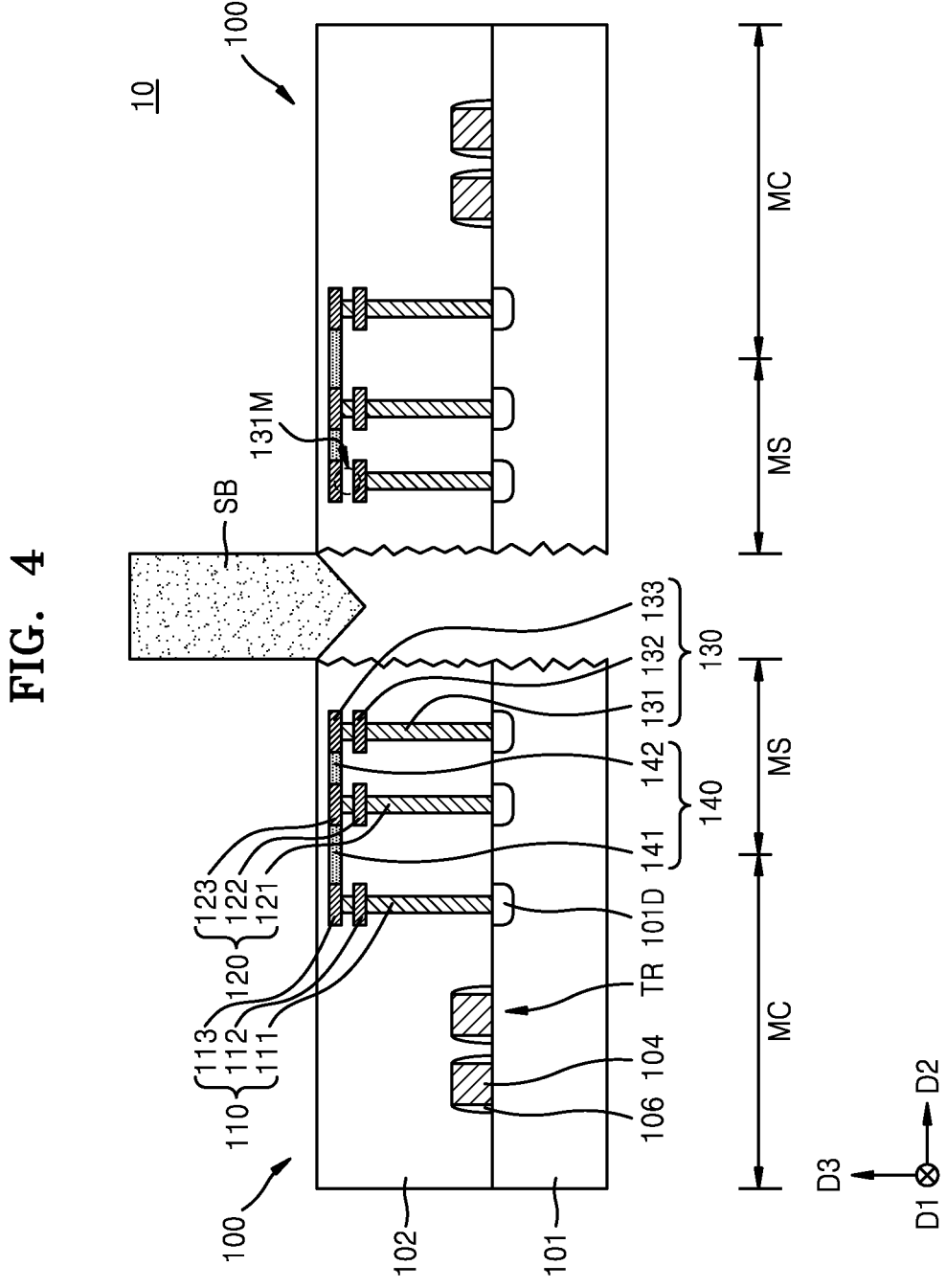
FIG. 4 is a vertical cross-sectional view showing a state in which the wafer of FIG. 1 is cut to manufacture the semiconductor device, according to an embodiment of the inventive concept.

FIG. 1 is a schematic plan view showing a wafer including a semiconductor device, according to an embodiment of the inventive concept. FIG. 2 is a schematic plan view of the semiconductor device of FIG. 1 showing an enlarged portion AA of FIG. 1, according to an embodiment of the inventive concept. FIG. 3 is a schematic vertical cross-sectional view of the semiconductor device of FIG. 1 cut along line B-B' of FIG. 2, according to an embodiment of the inventive concept. FIG. 4 is a vertical cross-sectional view showing a state in which the wafer of FIG. 1 is cut to manufacture the semiconductor device, according to an embodiment of the inventive concept.

Referring to FIGS. 1 to 4, according to embodiments, a wafer 10 includes a scribe lane region SL defined between a semiconductor device 100 including a main chip region MC and a plurality of semiconductor devices 100.

The wafer 10 has an edge portion 10E. Also, the wafer 10 has an upper surface on which the plurality of semiconductor devices 100 is formed and a lower surface facing the upper surface. The lower surface may be a polished surface on which a polishing process is performed to reduce a thickness of the wafer 10. The polishing process may include a grinding method.

The plurality of semiconductor devices 100 is arranged on the upper surface of the wafer 10, and the scribe lane region SL may be defined between the plurality of semiconductor devices 100. The semiconductor device 100 according to an embodiment of the inventive concept may include the main chip region MC and a sealing region MS surrounding the main chip region MC. For convenience of description, only some components constituting the semiconductor device 100 are illustrated in the drawings, but one of ordinary skill in the art will be able to fully understand the remaining components that are not illustrated.

The scribe lane region SL may extend in a first direction D1 and a second direction D2 substantially perpendicular to the first direction D1. The scribe lane region SL may be in the form of a straight lane having a constant width. That is, the plurality of semiconductor devices 100 may be surrounded by the scribe lane region SL and may be spaced apart from each other.

Generally, the plurality of semiconductor devices 100 may be physically separated from each other in the form of a semiconductor chip by performing a die sawing process along the scribe lane region SL. For example, the wafer 10 and various types of material layers formed on the wafer 10 are cut by the die sawing process using a sawing blade SB, and thus, the wafer 10 may be cut into the plurality of semiconductor devices 100.

As the demand for large capacity and high integration of an integrated circuit device TR increases, an area occupied by the scribe lane region SL of the wafer 10 decreases. Accordingly, the risk of damage to the integrated circuit device TR increases due to electrical and mechanical stress applied to the semiconductor device 100 in the die sawing process. Accordingly, the semiconductor device 100 capable of preventing or reducing a defect of the integrated circuit device TR is manufactured by forming a guard ring 120 and a moisture-proof ring 130 in the sealing region MS. The moisture-proof ring 130 may prevent or reduce the propagation of cracks and/or the penetration of moisture that may occur in the die sawing process, and the guard ring 120 may ground the semiconductor device 100. Hereinafter, the semiconductor device 100 according to embodiments of the inventive concept will be described in detail.

A semiconductor substrate 101 may include a semiconductor material such as, for example, silicon (Si). Alternatively, the semiconductor substrate 101 may include a semiconductor element material such as, for example, germanium (Ge), or a compound semiconductor material such as, for example, silicon carbide (SiC), gallium arsenide (GaAs), indium arsenide (InAs), and indium phosphide (InP). In some embodiments, the semiconductor substrate 101 may have a silicon on insulator (SOI) structure. The semiconductor substrate 101 may include a conductive region, for example, a well doped with impurities or a structure doped with impurities.

The integrated circuit device TR may be arranged in the main chip region MC of the semiconductor device 100. The integrated circuit device TR may include, for example, a memory device and/or a logic device. Also, the integrated circuit device TR may include various types of a plurality of individual devices. The plurality of individual devices may include various microelectronic devices such as, for example, a metal-oxide-semiconductor field-effect transistor (MOSFET) such as a complementary metal-oxide semiconductor (CMOS), a system large scale integration (LSI) device, an image sensor such as a CMOS imaging sensor (CIS), a microelectromechanical system (MEMS), an active device, and a passive device.

The guard ring 120 and the moisture-proof ring 130 may be formed to surround the main chip region MC of the semiconductor device 100 in the sealing region MS of the semiconductor device 100 adjacent to the scribe lane region SL. The guard ring 120 and the moisture-proof ring 130 may extend in a third direction D3 substantially perpendicular to an upper surface of the semiconductor substrate 101.

The semiconductor device 100 includes at least one integrated circuit device TR and an electrode structure 110 in the main chip region MC, and includes an insulating layer 102 surrounding the integrated circuit device TR and the electrode structure 110 on the semiconductor substrate 101. The insulating layer 102 may include, but is not limited to, silicon oxide, silicon nitride, or silicon oxynitride. Also, the insulating layer 102 may include a plurality of insulating interlayers.

The integrated circuit device TR may be formed by forming a gate electrode 104 and spacers 106 on both side walls of the gate electrode 104, and doping impurities in the semiconductor substrate 101 arranged on both sides of the gate electrode 104.

A method of forming the integrated circuit device TR will be briefly described as follows. A gate forming layer is formed on the semiconductor substrate 101. A mask pattern used to form a plurality of gate electrodes 104 is formed on the gate forming layer. The plurality of gate electrodes 104 is formed on the semiconductor substrate 101 by etching the gate forming layer using the mask pattern as an etching mask. A spacer forming layer covering the plurality of gate electrodes 104 is formed. The spacers 106 may be formed on both side walls of the plurality of gate electrodes 104, respectively, by anisotropically etching the spacer forming layer. A source and a drain are formed by doping impurities in the semiconductor substrate 101 arranged on both sides of the gate electrode 104.

In some embodiments, the guard ring 120 and the moisture-proof ring 130 may be formed together in the sealing region MS in a process of forming the electrode structure 110 in the main chip region MC. That is, in embodiments, the guard ring 120 and the moisture-proof ring 130 may be formed using a semiconductor manufacturing process without utilizing an additional process for forming the guard ring 120 and the moisture-proof ring 130. Accordingly, the electrode structure 110, the guard ring 120, and the moisture-proof ring 130 may be formed to have a similar shape. According to embodiments, the electrode structure 110, the guard ring 120, and the moisture-proof ring 130 are all in direct contact with the semiconductor substrate 101.

The electrode structure 110 may include a vertical via 111 and a plurality of metal wiring layers 112 and 113. Similarly, the guard ring 120 may include a vertical via 121 and a plurality of metal wiring layers 122 and 123, and the moisture-proof ring 130 may include a vertical via 131 and a plurality of metal wiring layers 132 and 133.

Through a photo process and an etching process, the electrode structure 110, the guard ring 120, and the moisture-proof ring 130 may be formed by patterning the vertical vias 111, 121, and 131 and the plurality of metal wiring layers 112, 113, 122, 123, 132, and 133 in a desired shape. The vertical vias 111, 121, and 131 may extend in the third direction D3. The plurality of metal wiring layers 112 and 113 constituting the electrode structure 110 may have a dot shape having a certain area. In contrast, the plurality of metal wiring layers 122, 123, 132, and 133 constituting the guard ring 120 and the moisture-proof ring 130 may extend in the first direction D1 and the second direction D2 and form a closed region.

The electrode structure 110, the guard ring 120, and the moisture-proof ring 130 may include a conductive material. In some embodiments, the electrode structure 110, the guard ring 120, and the moisture-proof ring 130 may include, for example, tungsten (W), a tungsten alloy, copper (Cu), or a copper alloy. Alternatively, the electrode structure 110, the guard ring 120, and the moisture-proof ring 130 may include, for example, aluminum (Al), titanium (Ti), tantalum (Ta), palladium (Pd), platinum (Pt), molybdenum (Mo), metal silicide, or a combination thereof.

The vertical vias 111, 121, and 131 may be in direct contact with a plurality of doped regions 101D inside the semiconductor substrate 101. The plurality of doped regions 101D may be regions doped with p-type impurities. Alternatively, the plurality of doped regions 101D may be regions doped with n-type impurities. The electrode structure 110, the guard ring 120, and the moisture-proof ring 130 may be grounded via the doped regions 101D in contact with the vertical vias 111, 121, and 131. In some embodiments, the electrode structure 110 and the guard ring 120 are in direct contact with the doped regions 101D via the vertical vias 111, 121, and 131.

The semiconductor device 100 according to an embodiment of the inventive concept may include a metal pattern structure 140 electrically connecting the electrode structure 110, the guard ring 120, and the moisture-proof ring 130 to each other. The metal pattern structure 140 may be configured in a bridge-shaped pattern extending across the guard ring 120 from the electrode structure 110 of the main chip region MC to the moisture-proof ring 130 of the sealing region MS.

The difficulty in designing a semiconductor manufacturing process while facilitating current movement through the metal pattern structure 140 may be decreased by adjusting the number and width of the metal pattern structure 140. That is, by taking a diameter of the semiconductor substrate 101, the number of the guard ring 120 and the moisture-proof ring 130, heights of the guard ring 120 and the moisture-proof ring 130, a magnitude of flowing current, etc. into consideration, the number and width of the metal pattern structure 140 may be adjusted.

The metal pattern structure 140 may include a first sub metal pattern structure 141 connecting the electrode structure 110 of the main chip region MC to the guard ring 120 of the sealing region MS, and a second sub metal pattern structure 142 connecting the guard ring 120 to the moisture-proof ring 130 in the sealing region MS.

In some embodiments, the moisture-proof ring 130 may be directly grounded to the semiconductor substrate 101 via the vertical via 131. Alternatively, the moisture-proof ring 130 may be grounded to the semiconductor substrate 101 via the guard ring 120 using the second sub metal pattern structure 142 as a connection line. Alternatively, the moisture-proof ring 130 may be grounded to the semiconductor substrate 101 via the electrode structure 110 using the first sub metal pattern structure 141 and the second sub metal pattern structure 142 as connection lines.

In some embodiments, a level of an upper surface of the guard ring 120 and a level of an upper surface of the moisture-proof ring 130 may be substantially equal to a level of an upper surface of the metal pattern structure 140. For example, in some embodiments, the upper surface of the guard ring 120 and the upper surface of the moisture-proof ring 130 may be substantially coplanar with the upper surface of the metal pattern structure 140. The moisture-proof ring 130 may be formed in a closed quadrangular shape having four edges, and the metal pattern structure 140 may be formed to be in contact with one of the four edges constituting the moisture-proof ring 130.

Generally, the plurality of semiconductor devices 100 may be physically separated from each other in the form of a semiconductor chip by performing a die sawing process along the scribe lane region SL. The guard ring 120 and the moisture-proof ring 130 are formed in the sealing region MS, and may prevent or reduce the propagation of cracks and/or the penetration of moisture that may occur in this process. Charged particles may be generated due to plasma used in an etching process that is part of a process of forming the guard ring 120 and the moisture-proof ring 130. The charged particles flow to the semiconductor substrate 101 using the vertical via 131 of the moisture-proof ring 130 as a ground line.

However, in a process of forming the moisture-proof ring 130, the semiconductor device 100 including a missing region 131M in which a portion of the vertical via 131 is not patterned may be included in the semiconductor substrate 101. This phenomenon may have an effect on the semiconductor device 100 adjacent to the edge portion 10E of the wafer 10. As such, charged particles may be accumulated in an upper metal wiring layer 133 of the moisture-proof ring 130 in the semiconductor device 100 including the missing region 131M. In this case, an arcing phenomenon may occur in the semiconductor device 100. That is, charged particles may accumulate in the upper metal wiring layer 133 in an ungrounded state (or in a floating state) and the arcing phenomenon may occur, which may thereby affect the integrated circuit device TR of the semiconductor device 100. As a result, a defect rate of the semiconductor device 100 may increase.

According to embodiments of the inventive concept, the semiconductor device 100 includes the metal pattern structure 140 that connects the electrode structure 110 and the guard ring 120 to each other so that the electrode structure 110 and the guard ring 120 act as a preliminary ground line in relation to the moisture-proof ring 130, even when the semiconductor device 100 includes the missing region 131M. Accordingly, even when the moisture-proof ring 130 having the missing region 131M exists, an arcing phenomenon occurring from charged particles due to plasma may be prevented or reduced in advance. As a result, prevention of or a reduction in a defect rate of the semiconductor device 100 may be realized.

Since the semiconductor device 100 according to embodiments of the inventive concept may efficiently suppress a defect such as an arcing phenomenon, product productivity and product reliability may be increased.

Figure 5:
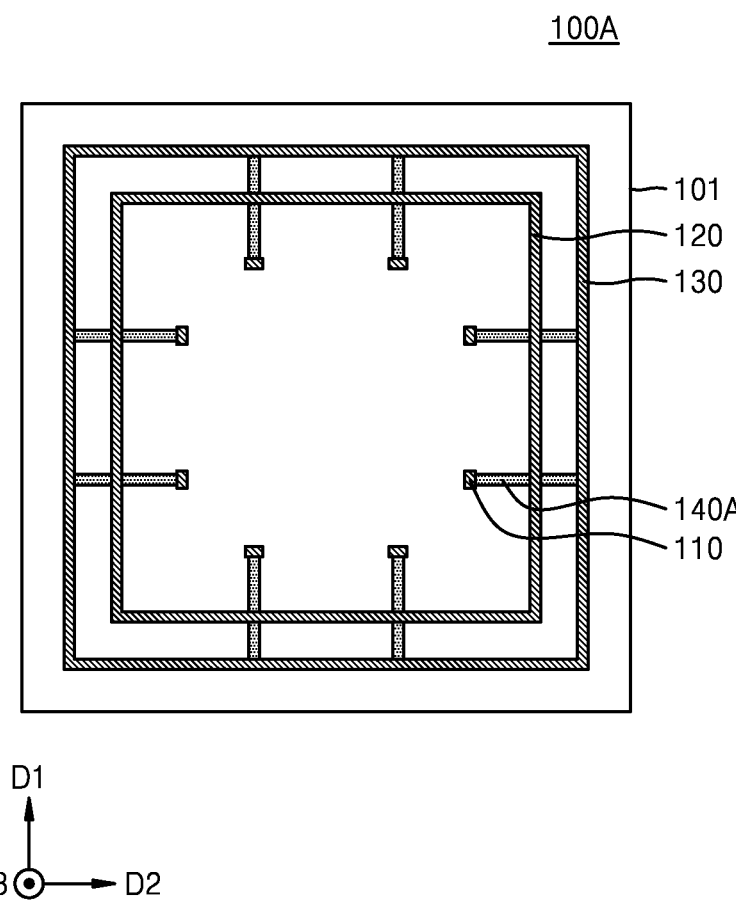
FIGS. 5 and 6 illustrate a semiconductor device, according to an embodiment of the inventive concept.
Figure 6:
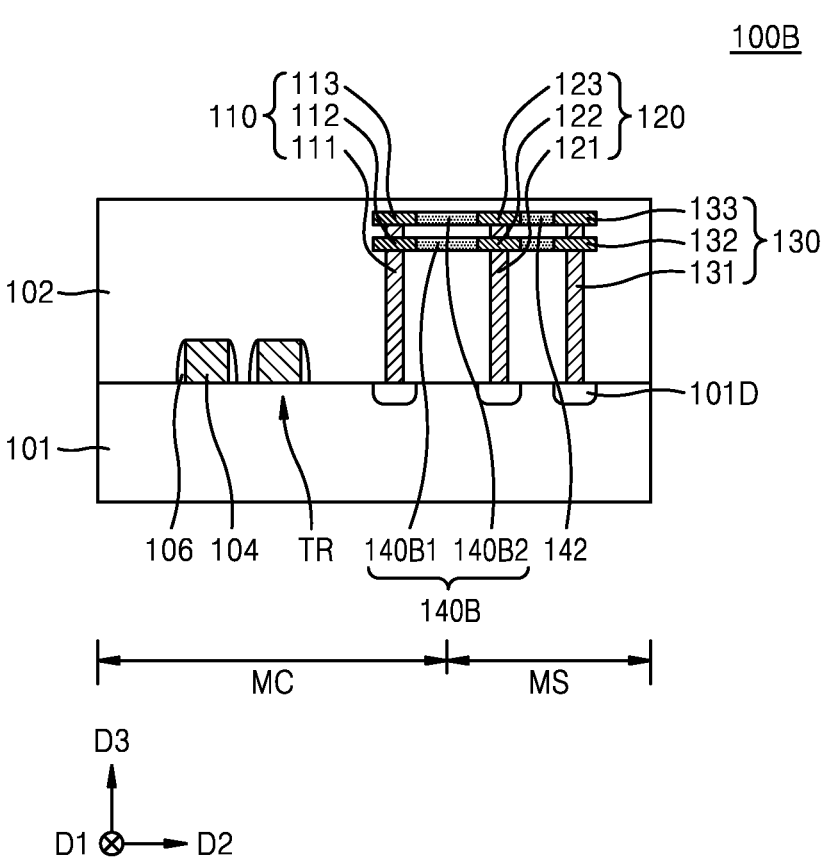

FIGS. 5 and 6 illustrate a semiconductor device, according to an embodiment of the inventive concept.

Hereinafter, most of the components constituting a semiconductor device 100A and a semiconductor device 100B to be described below, and materials used to form the components, are substantially the same as or similar to the semiconductor device 100 described above with reference to FIGS. 1 to 4. Therefore, for convenience for explanation, differences between the semiconductor devices 100A and 100B and the semiconductor device 100 described above will be mainly described, and a further description of components and technical aspects previously described may be omitted.

Referring to FIG. 5, the semiconductor device 100A may include a plurality of metal pattern structures 140A that electrically connect the electrode structure 110, the guard ring 120, and the moisture-proof ring 130 to each other.

In the semiconductor device 100A according to an embodiment of the inventive concept, the plurality of metal pattern structures 140A may be configured in a bridge-shaped pattern extending across the guard ring 120 from the electrode structure 110 of the main chip region MC to the moisture-proof ring 130 of the sealing region MS.

As shown in FIG. 5, the moisture-proof ring 130 may be formed in a closed quadrangular shape having four edges, and each one of the four edges constituting the moisture-proof ring 130 has two of the metal pattern structures 140A formed to be in contact therewith. However, the number of the plurality of metal pattern structures 140A is not limited thereto.

The difficulty in designing a semiconductor manufacturing process while facilitating current movement through the plurality of metal pattern structures 140A may be decreased by adjusting the number and width of the plurality of metal pattern structures 140A. That is, by taking a diameter of the semiconductor substrate 101, the number of the guard ring 120 and the moisture-proof ring 130, heights of the guard ring 120 and the moisture-proof ring 130, a magnitude of flowing current, etc. into consideration, the number and width of the plurality of metal pattern structures 140A may be adjusted.

Referring to FIG. 6, the semiconductor device 100B may include a plurality of metal pattern structures 140B that electrically connect the electrode structure 110, the guard ring 120, and the moisture-proof ring 130 to each other.

In the semiconductor device 100B according to an embodiment of the inventive concept, the plurality of metal pattern structures 140B may be configured in a bridge-shaped pattern extending across the guard ring 120 from the electrode structure 110 of the main chip region MC to the moisture-proof ring 130 of the sealing region MS.

As shown in FIG. 6, the electrode structure 110 may include the vertical via 111 and the plurality of metal wiring layers 112 and 113. Similarly, the guard ring 120 may include the vertical via 121 and the plurality of metal wiring layers 122 and 123, and the moisture-proof ring 130 may include the vertical via 131 and the plurality of metal wiring layers 132 and 133. The plurality of metal pattern structures 140B may include a lower metal pattern structure 140B1 that electrically connects lower metal wiring layers 112, 122, and 132 to each other, and an upper metal pattern structure 140B2 that electrically connects upper metal wiring layers 113, 123, and 133 to each other.

The difficulty in designing a semiconductor manufacturing process while facilitating current movement through the plurality of metal pattern structures 140B may be decreased by configuring the plurality of metal pattern structures 140B into upper and lower portions thereof. That is, by taking a diameter of the semiconductor substrate 101, the number of the guard ring 120 and the moisture-proof ring 130, heights of the guard ring 120 and the moisture-proof ring 130, a magnitude of flowing current, etc. into consideration, a level at which the plurality of metal pattern structures 140B are arranged may be adjusted.

Figure 7:
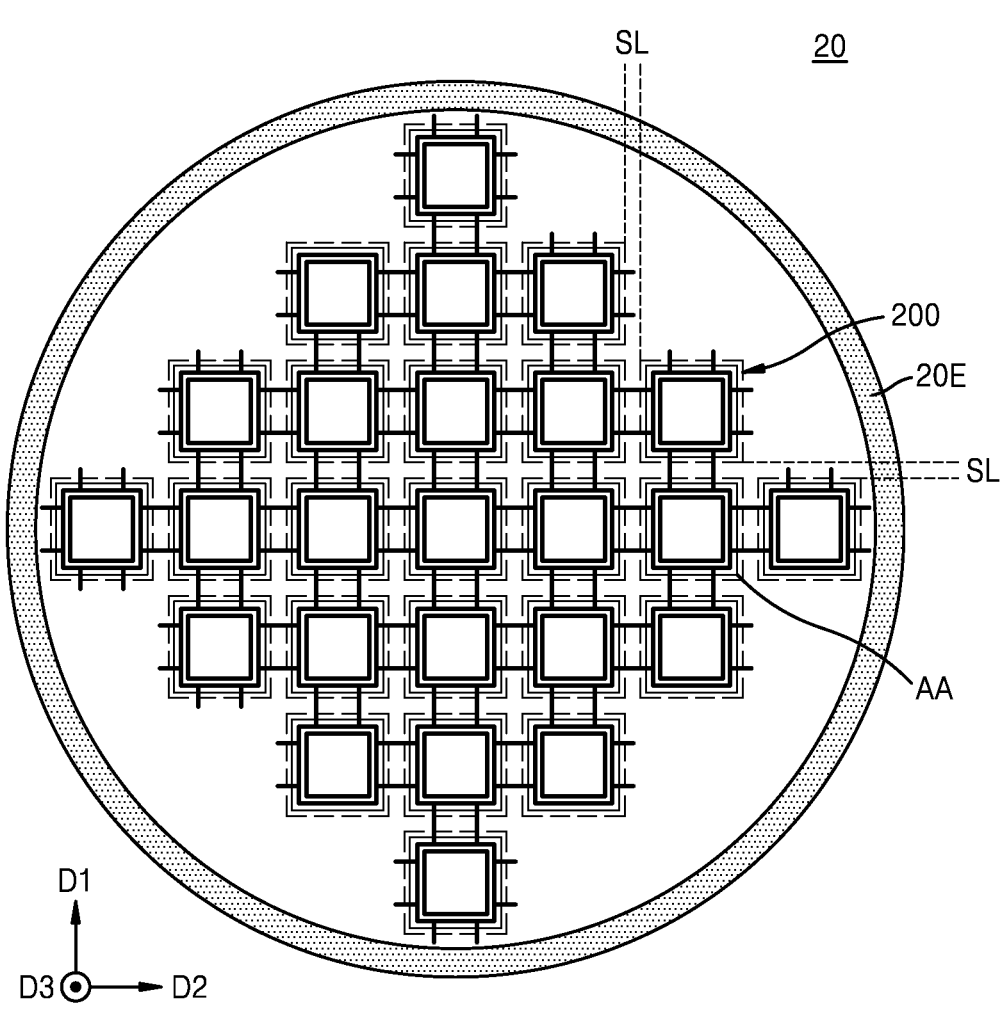
FIG. 7 is a schematic plan view showing a wafer including a semiconductor device, according to an embodiment of the inventive concept.
Figure 8:
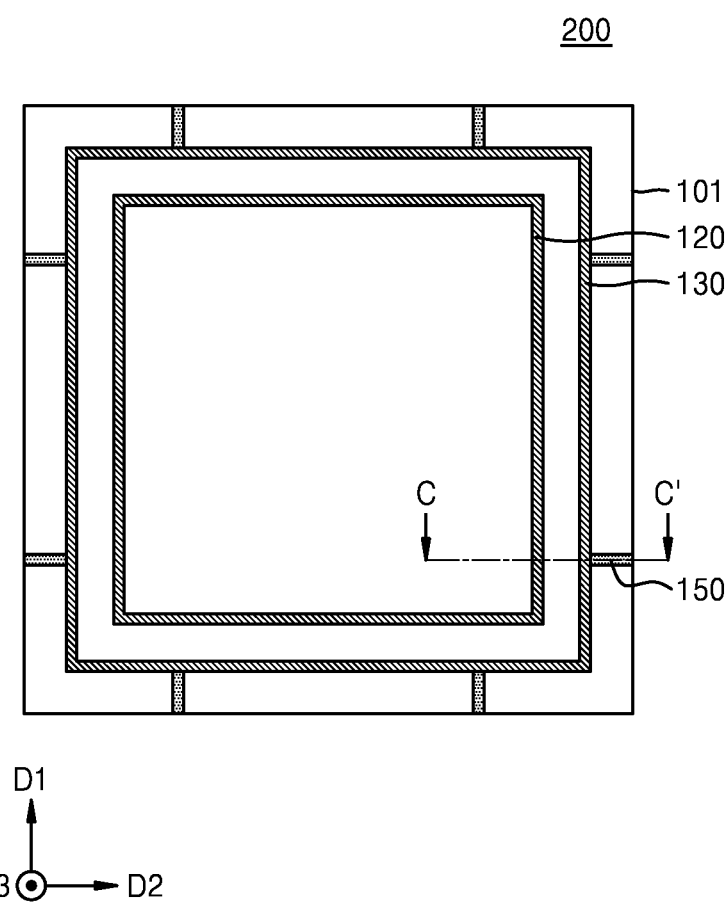
FIG. 8 is a schematic plan view of the semiconductor device of FIG. 7 showing an enlarged portion AA of FIG. 7, according to an embodiment of the inventive concept.
Figure 9:
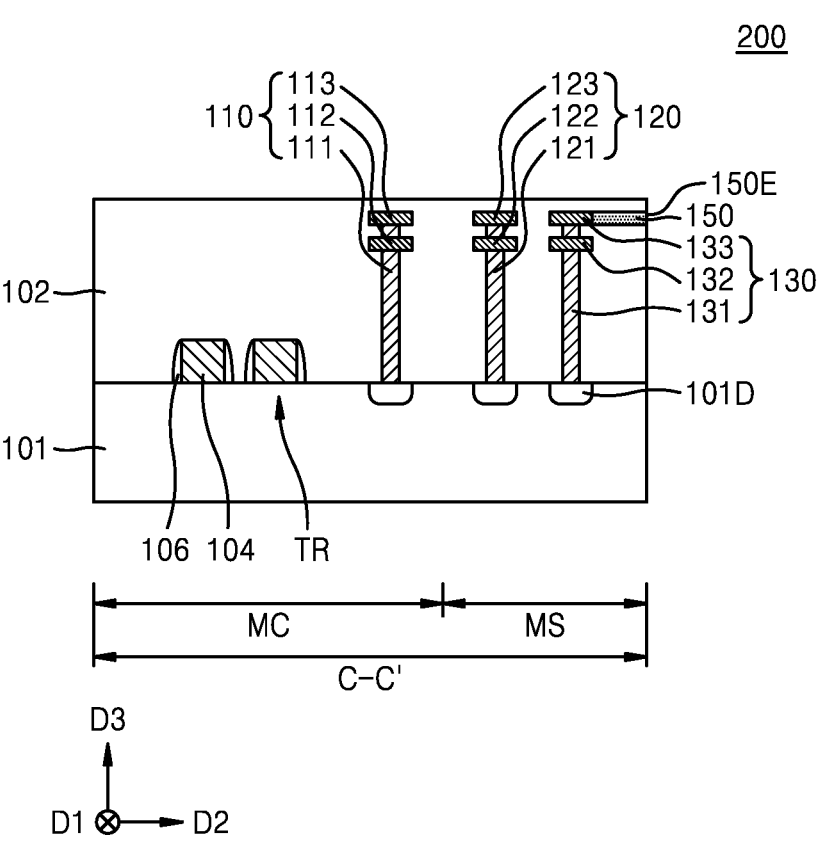
FIG. 9 is a schematic vertical cross-sectional view of the semiconductor device of FIG. 7 cut along line C-C' of FIG. 8, according to an embodiment of the inventive concept.
Figure 10:
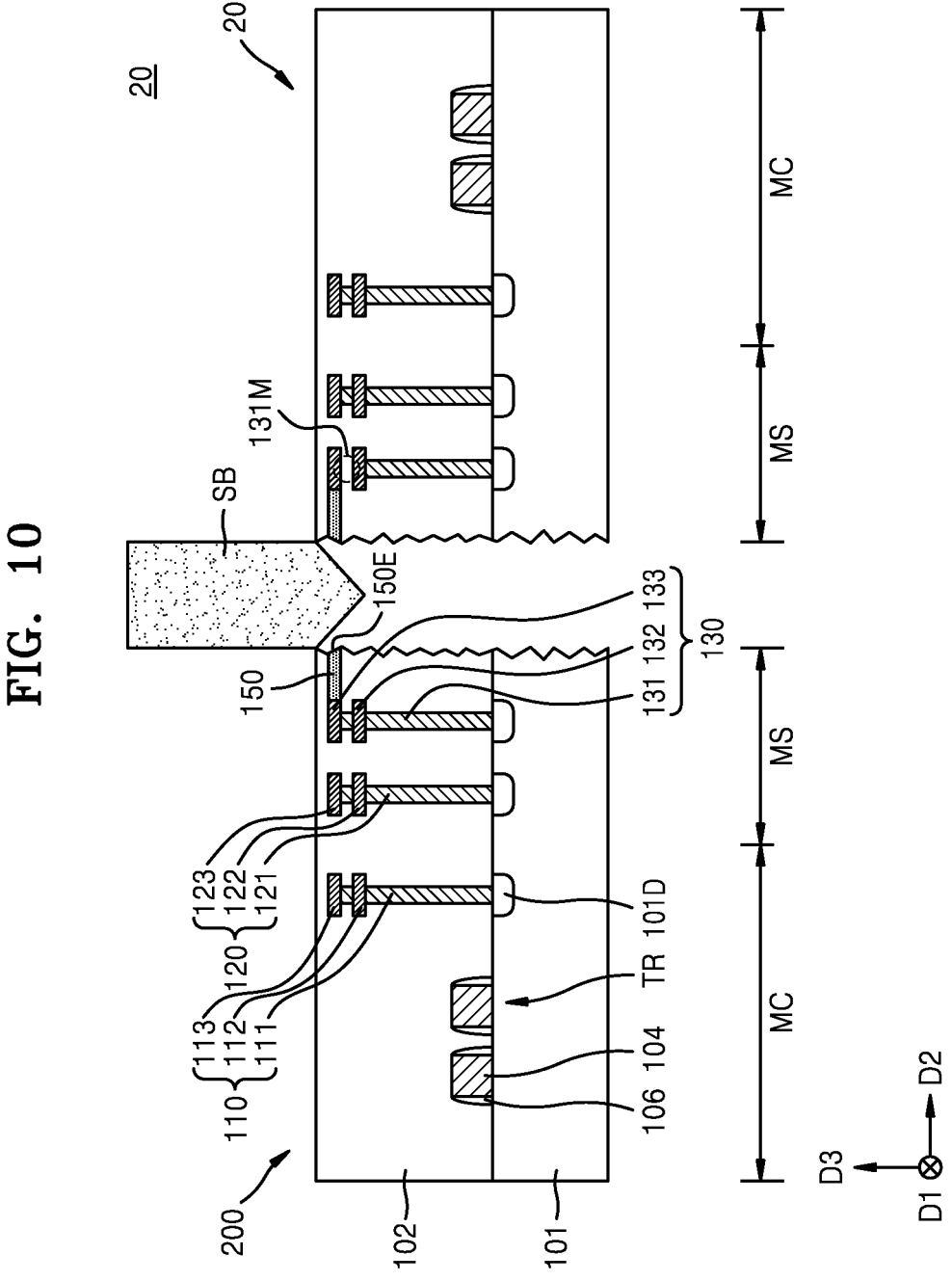
FIG. 10 is a vertical cross-sectional view showing a state in which the wafer of FIG. 7 is cut to manufacture the semiconductor device, according to an embodiment of the inventive concept.

FIG. 7 is a schematic plan view showing a wafer including a semiconductor device, according to an embodiment of the inventive concept. FIG. 8 is a schematic plan view of the semiconductor device of FIG. 7 showing an enlarged portion AA of FIG. 7, according to an embodiment of the inventive concept. FIG. 9 is a schematic vertical cross-sectional view of the semiconductor device of FIG. 7 cut along line C-C' of FIG. 8, according to an embodiment of the inventive concept. FIG. 10 is a vertical cross-sectional view showing a state in which the wafer of FIG. 7 is cut to manufacture the semiconductor device, according to an embodiment of the inventive concept.

Referring to FIGS. 7 to 10, according to embodiments, a wafer 20 includes the scribe lane region SL defined between a semiconductor device 200 including the main chip region MC and a plurality of semiconductor devices 200.

The semiconductor substrate 101 is substantially the same as that described above with reference to FIGS. 1 to 4, and thus, for convenience of explanation, a further description of components and technical aspects previously described will not be repeated.

The integrated circuit device TR may be arranged in the main chip region MC of the semiconductor device 200. The integrated circuit device TR may include a memory device and/or a logic device. Also, the integrated circuit device TR may include various types of a plurality of individual devices. Also, the guard ring 120 and the moisture-proof ring 130 are arranged in the sealing region MS of the semiconductor device 200, which may prevent or reduce the propagation of cracks and/or the penetration of moisture that may occur in a die sawing process.

The guard ring 120 and the moisture-proof ring 130 may be formed to surround the main chip region MC of the semiconductor device 200 in the sealing region MS of the semiconductor device 200 adjacent to the scribe lane region SL.

The guard ring 120 and the moisture-proof ring 130 may be formed together in the sealing region MS in a process of forming the electrode structure 110 in the main chip region MC. That is, in embodiments, the guard ring 120 and the moisture-proof ring 130 may be formed using a semiconductor manufacturing process without utilizing an additional process for forming the guard ring 120 and the moisture-proof ring 130. Accordingly, the electrode structure 110, the guard ring 120, and the moisture-proof ring 130 may be formed to have a similar shape.

The electrode structure 110 may include the vertical via 111 and the plurality of metal wiring layers 112 and 113. Similarly, the guard ring 120 may include the vertical via 121 and the plurality of metal wiring layers 122 and 123, and the moisture-proof ring 130 may include the vertical via 131 and the plurality of metal wiring layers 132 and 133.

The semiconductor device 200 according to an embodiment of the inventive concept may include a plurality of metal pattern structures 150 configured in a bridge-shaped pattern extending in a direction crossing the sealing region MS from the moisture-proof ring 130 to an outermost portion of the sealing region MS.

The difficulty in designing a semiconductor manufacturing process while facilitating current movement through the plurality of metal pattern structures 150 may be decreased by adjusting the number and width of the plurality of metal pattern structures 150. That is, by taking a diameter of the semiconductor substrate 101, the number of the moisture-proof ring 130, a height of the moisture-proof ring 130, a magnitude of flowing current, etc. into consideration, the number and width of the plurality of metal pattern structures 150 may be adjusted.

In some embodiments, the moisture-proof ring 130 may be directly grounded to the semiconductor substrate 101 via the vertical via 131. Alternatively, the moisture-proof ring 130 may be grounded to the semiconductor substrate 101 via the moisture-proof ring 130 of the neighboring semiconductor device 200 using the plurality of metal pattern structures 150 as connection lines.

The plurality of semiconductor devices 200 connected to each other by the plurality of metal pattern structures 150 may be physically separated from each other in the form of a semiconductor chip by performing a die sawing process along the scribe lane region SL. For example, the wafer 20 and various types of material layers formed on the wafer 20 are cut by the die sawing process using the sawing blade SB, and thus, the wafer 20 may be cut into the plurality of semiconductor devices 200. Therefore, the plurality of metal pattern structures 150 may have an irregular fracture surface 150E due to the die sawing process.

In some embodiments, a level of an upper surface of the moisture-proof ring 130 may be substantially equal to a level of upper surfaces of the plurality of metal pattern structures 150. For example, in some embodiments, the upper surface of the moisture-proof ring 130 and the upper surfaces of the plurality of metal pattern structures 150 may be substantially coplanar with each other. The moisture-proof ring 130 may be formed in a closed quadrangular shape having four edges, and each of the four edges constituting the moisture-proof ring 130 has two of the metal pattern structures 150 formed to be in contact therewith.

The semiconductor device 200 including the missing region 131M may be included in the wafer 20 in a process of forming the moisture-proof ring 130. This phenomenon may have an effect on the semiconductor device 200 adjacent to an edge portion 20E of the wafer 20. As such, charged particles may be accumulated in the upper metal wiring layer 133 of the moisture-proof ring 130 in the semiconductor device 200 including the missing region 131M. In this case, an arcing phenomenon may occur in the semiconductor device 200. That is, charged particles may accumulate in the upper metal wiring layer 133 in an ungrounded state (or in a floating state) and the arcing phenomenon may occur, which may thereby affect the integrated circuit device TR of the semiconductor device 200. As a result, a defect rate of the semiconductor device 200 *i* may increase.

According to embodiments of the inventive concept, the semiconductor device 200 includes the plurality of metal pattern structures 150 that connect the moisture-proof rings 130 to each other so that the moisture-proof ring 130 of the neighboring semiconductor device 200 acts as a preliminary ground line in relation to the moisture-proof ring 130, even when the semiconductor device 200 includes the missing region 131M. Accordingly, even when the moisture-proof ring 130 having the missing region 131M exists, an arcing phenomenon occurring from charged particles due to plasma may be prevented or reduced in advance. As a result, prevention of or a reduction in a defect rate of the semiconductor device 200 may be realized.

Since the semiconductor device 200 according to embodiments of the inventive concept may efficiently suppress a defect such as an arcing phenomenon, product productivity and product reliability may be increased.

Figure 11:
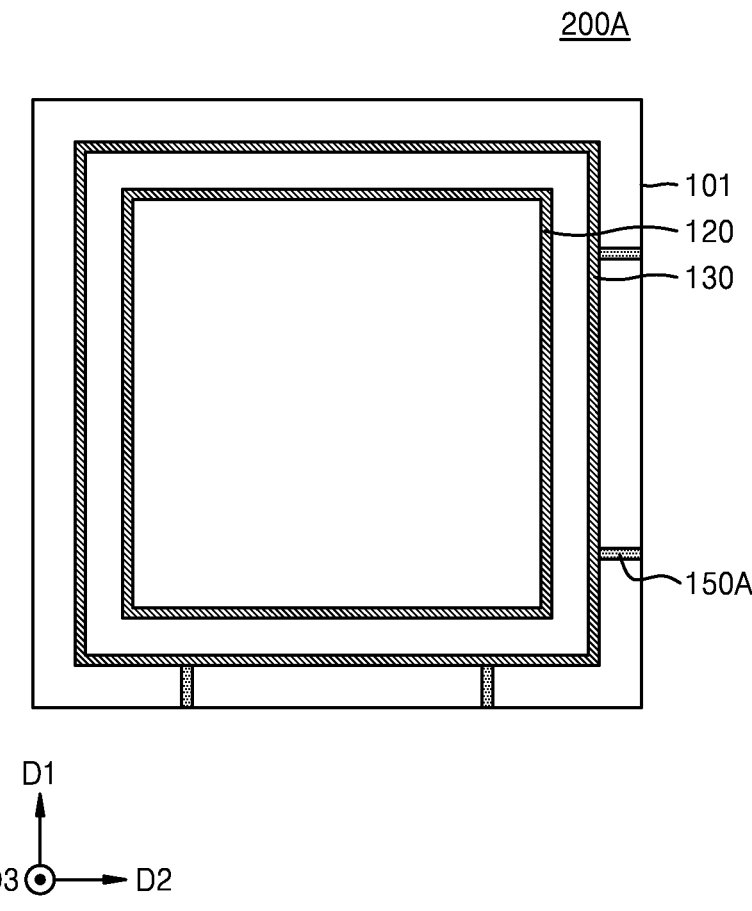
FIGS. 11 and 12 illustrate a semiconductor device, according to an embodiment of the inventive concept.
Figure 12:
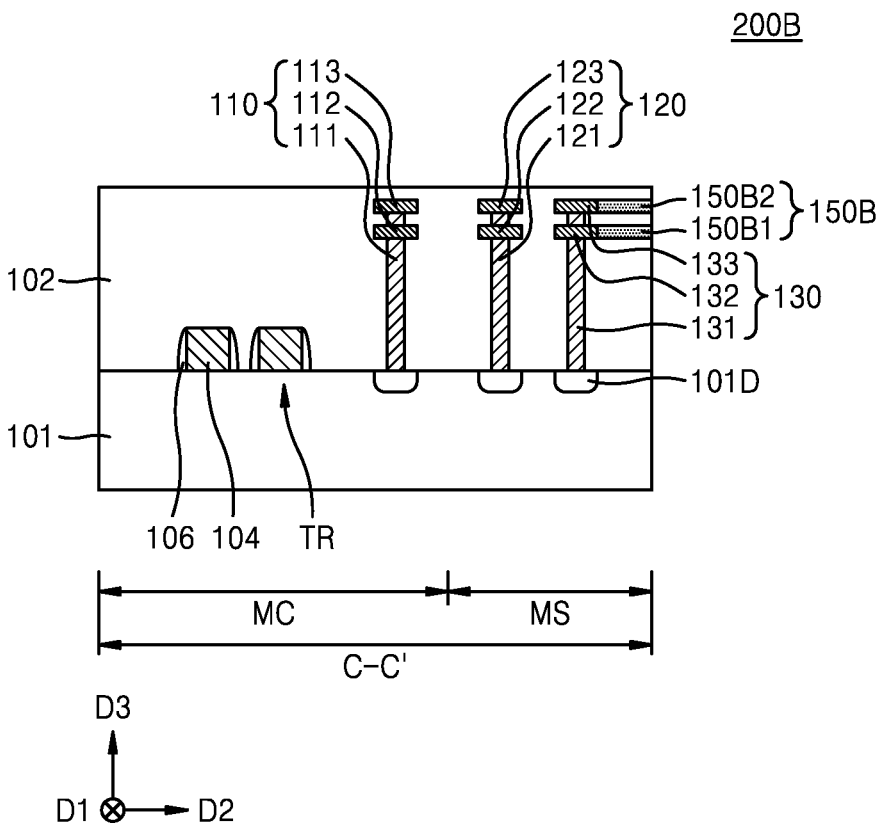

FIGS. 11 and 12 illustrate a semiconductor device, according to an embodiment of the inventive concept.

Hereinafter, most of the components constituting a semiconductor device 200A and a semiconductor device 200B to be described below, and materials used to form the components, are substantially the same as or similar to the semiconductor device 200 described above with reference to FIGS. 7 to 10. Therefore, for convenience for explanation, differences between the semiconductor devices 200A and 200B and the semiconductor device 200 described above will be mainly described, and a further description of components and technical aspects previously described may be omitted.

Referring to FIG. 11, the semiconductor device 200A may include a metal pattern structure 150A extending in a direction crossing the sealing region MS from the moisture-proof ring 130.

In the semiconductor device 200A according to an embodiment of the inventive concept, the metal pattern structure 150A may be configured in a bridge-shaped pattern extending in a direction crossing the sealing region MS from the moisture-proof ring 130 to the outermost portion of the sealing region MS.

As shown in FIG. 11, the moisture-proof ring 130 may be formed in a closed quadrangular shape having four edges, and at least one of the four edges constituting the moisture-proof ring 130 may have at least one of the metal pattern structure 150A. However, the number of the metal pattern structure 150A is not limited thereto.

The difficulty in designing a semiconductor manufacturing process while facilitating current movement through the metal pattern structure 150A may be decreased by adjusting the number and width of the metal pattern structure 150A. That is, by taking a diameter of the semiconductor substrate 101, the number of the guard ring 120 and the moisture-proof ring 130, heights of the guard ring 120 and the moisture-proof ring 130, a magnitude of flowing current, etc. into consideration, the number and width of the metal pattern structure 150A may be adjusted.

Referring to FIG. 12, the semiconductor device 200B may include a plurality of metal pattern structures 150B extending in a direction crossing the sealing region MS from the moisture-proof ring 130.

In the semiconductor device 200B according to an embodiment of the inventive concept, the plurality of metal pattern structures 150B may be configured in a bridge-shaped pattern extending in a direction crossing the sealing region MS from the moisture-proof ring 130 to the outermost portion of the sealing region MS.

As shown in FIG. 12, the moisture-proof ring 130 may include the vertical via 131 and the plurality of metal wiring layers 132 and 133. The plurality of metal pattern structures 150B may include a lower metal pattern structure 150B1 that is electrically connected to the lower metal pattern layer 132, and an upper metal pattern structure 150B2 that is electrically connected to the upper metal wiring layer 133.

The difficulty in designing a semiconductor manufacturing process while facilitating current movement through the plurality of metal pattern structures 150B may be decreased by configuring the plurality of metal pattern structures 150B into upper and lower portions thereof. That is, by taking a diameter of the semiconductor substrate 101, the number of the moisture-proof ring 130, a height of the moisture-proof ring 130, a magnitude of flowing current, etc. into consideration, a level at which the plurality of metal pattern structures 150B is arranged may be adjusted.

Figure 13:
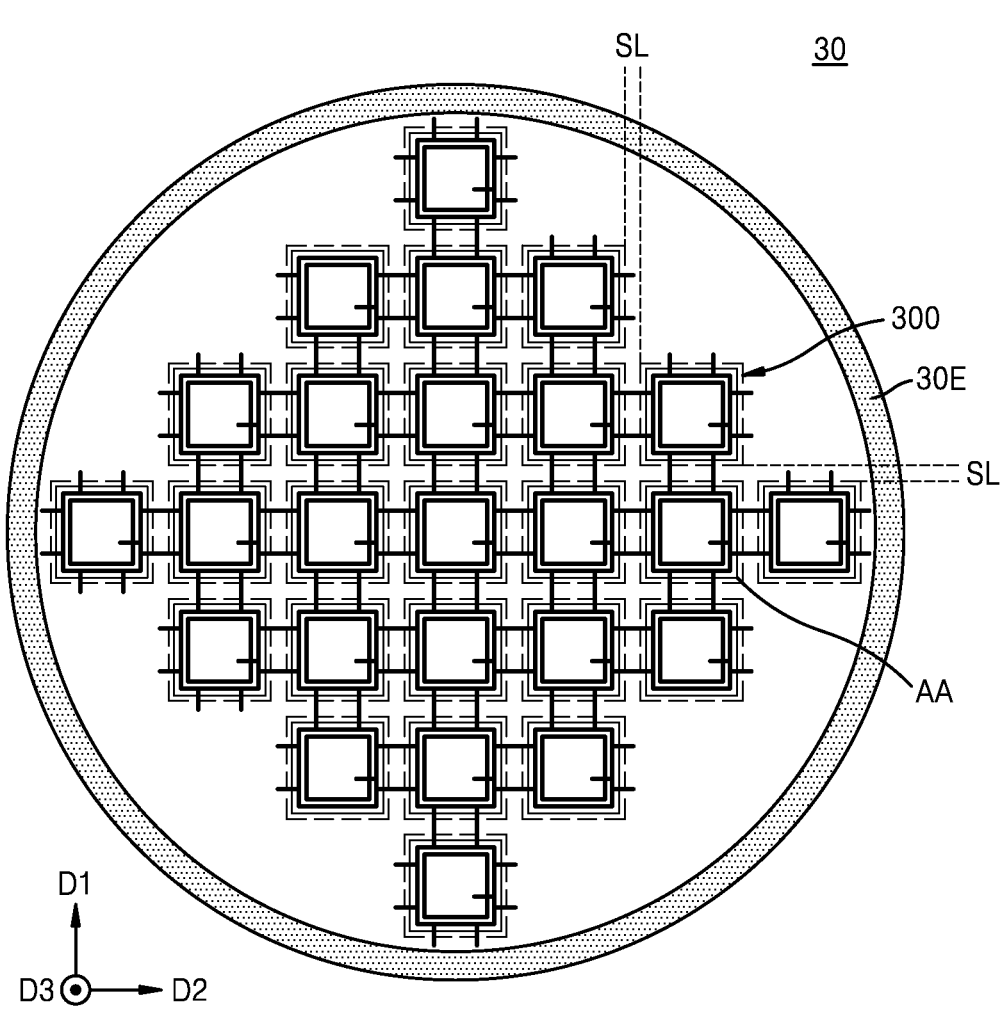
FIG. 13 is a schematic plan view showing a wafer including a semiconductor device, according to an embodiment of the inventive concept.
Figure 14:
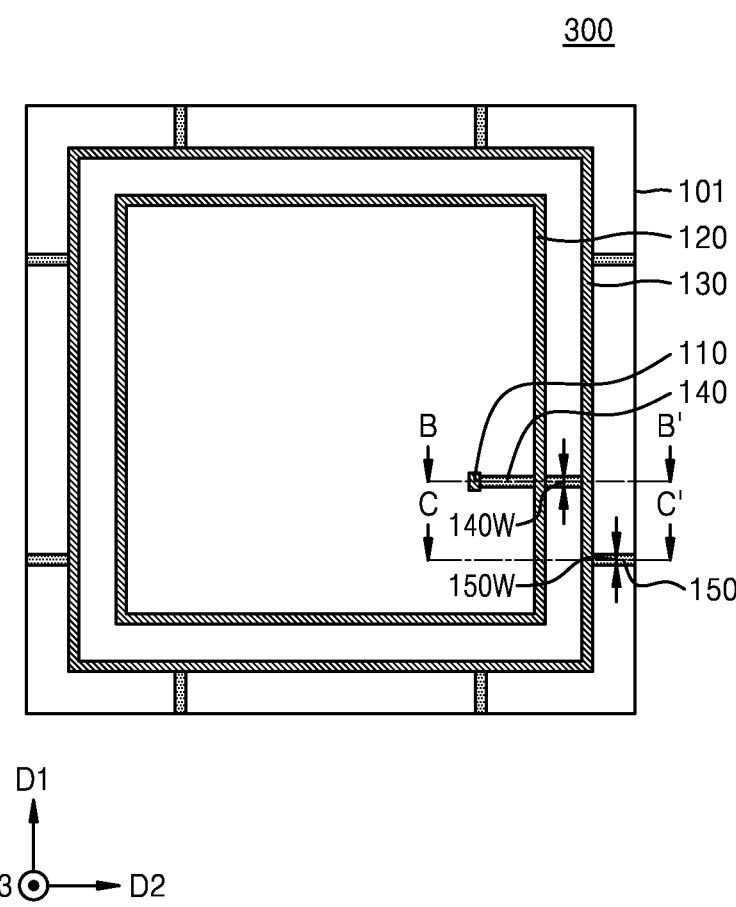
FIG. 14 is a schematic plan view of the semiconductor device of FIG. 13 showing an enlarged portion AA of FIG. 13, according to an embodiment of the inventive concept.
Figure 15:
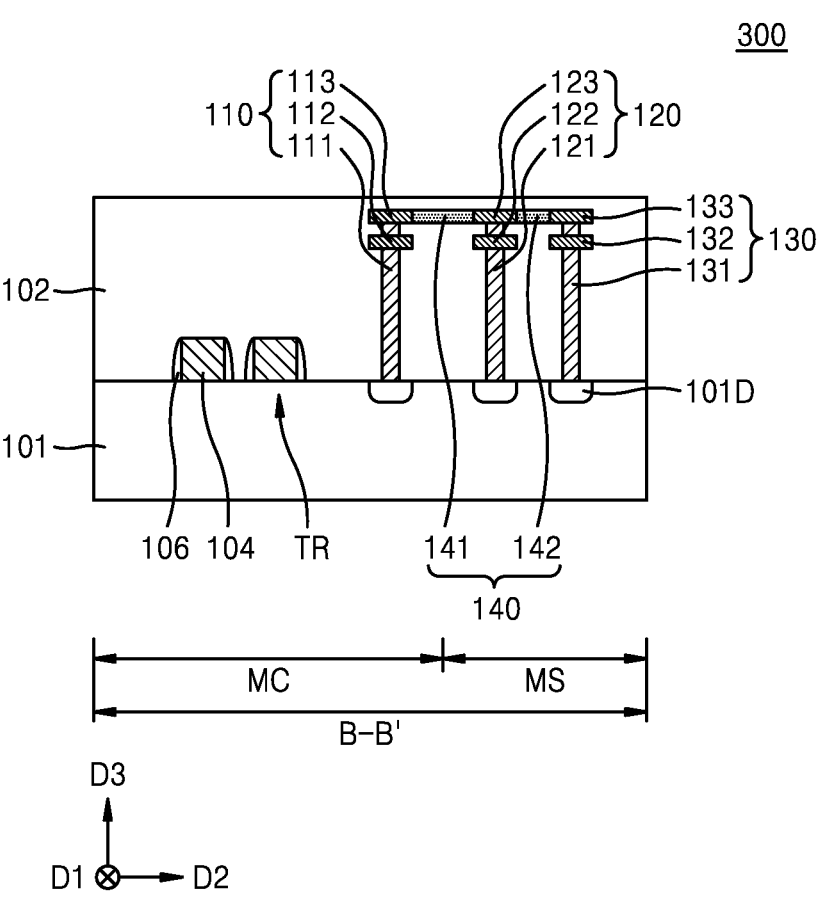
FIG. 15 is a schematic vertical cross-sectional view of the semiconductor device of FIG. 13 cut along line B-B' of FIG. 14, according to an embodiment of the inventive concept.
Figure 16:
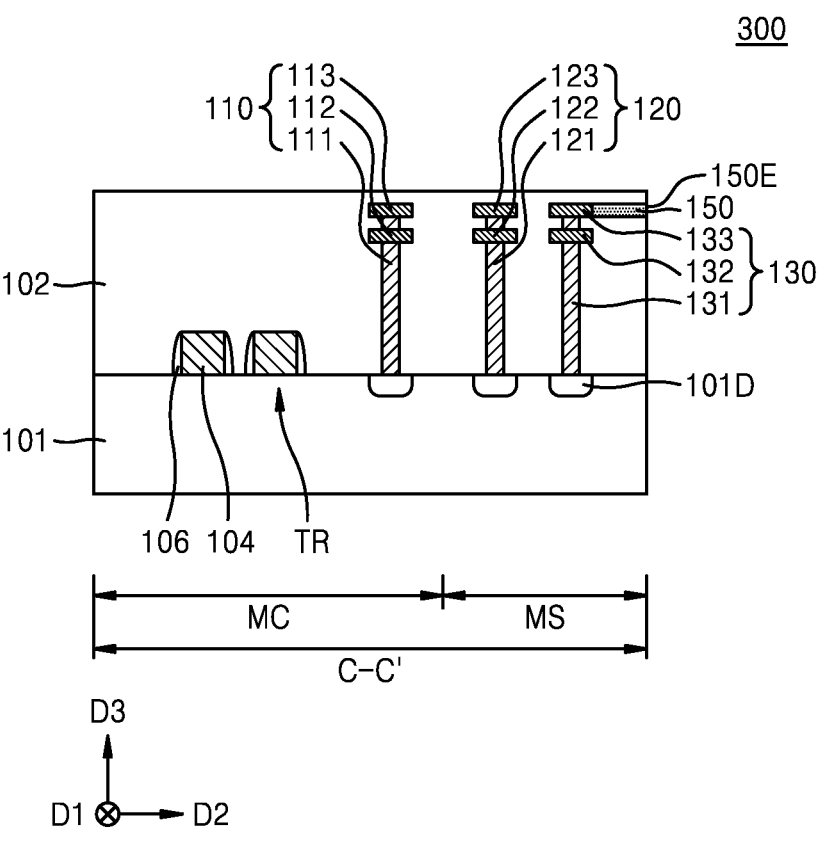
FIG. 16 is a schematic vertical cross-sectional view of the semiconductor device of FIG. 13 cut along line C-C' of FIG. 14, according to an embodiment of the inventive concept.

FIG. 13 is a schematic plan view showing a wafer including a semiconductor device, according to an embodiment of the inventive concept. FIG. 14 is a schematic plan view of the semiconductor device of FIG. 13 showing an enlarged portion AA of FIG. 13, according to an embodiment of the inventive concept. FIG. 15 is a schematic vertical cross-sectional view of the semiconductor device of FIG. 13 cut along line B-B' of FIG. 14, according to an embodiment of the inventive concept. FIG. 16 is a schematic vertical cross-sectional view of the semiconductor device of FIG. 13 cut along line C-C' of FIG. 14, according to an embodiment of the inventive concept.

Referring to FIGS. 13 to 16, according to embodiments, a wafer 30 includes the scribe lane region SL defined between a semiconductor device 300 including the main chip region MC and a plurality of semiconductor devices 300.

The semiconductor substrate 101 is substantially the same as that described above with reference to FIGS. 1 to 4, and thus, for convenience of explanation, a description thereof will not be repeated.

The integrated circuit device TR may be arranged in the main chip region MC of the semiconductor device 300. The integrated circuit device TR may include a memory device and/or a logic device. Also, the integrated circuit device TR may include various types of a plurality of individual devices. Also, the guard ring 120 and the moisture-proof ring 130 are arranged in the sealing region MS of the semiconductor device 300, which may prevent or reduce the propagation of cracks and/or the penetration of moisture that may occur in a die sawing process.

The guard ring 120 and the moisture-proof ring 130 may be formed to surround the main chip region MC of the semiconductor device 300 in the sealing region MS of the semiconductor device 300 adjacent to the scribe lane region SL.

The guard ring 120 and the moisture-proof ring 130 may be formed together in the sealing region MS in a process of forming the electrode structure 110 in the main chip region MC. That is, in embodiments, the guard ring 120 and the moisture-proof ring 130 may be formed using a semiconductor manufacturing process without utilizing an additional process for forming the guard ring 120 and the moisture-proof ring 130. Accordingly, the electrode structure 110, the guard ring 120, and the moisture-proof ring 130 may be formed to have a similar shape.

Through a photo process and an etching process, the electrode structure 110, the guard ring 120, and the moisture-proof ring 130 may be formed by patterning the vertical vias 111, 121, and 131 and the plurality of metal wiring layers 112, 113, 122, 123, 132, and 133 in a desired shape.

The electrode structure 110 may include the vertical via 111 and the plurality of metal wiring layers 112 and 113. Similarly, the guard ring 120 may include the vertical via 121 and the plurality of metal wiring layers 122 and 123, and the moisture-proof ring 130 may include the vertical via 131 and the plurality of metal wiring layers 132 and 133.

The semiconductor device 300 according to an embodiment of the inventive concept may include a first metal pattern structure 140 electrically connecting the electrode structure 110, the guard ring 120, and the moisture-proof ring 130 to each other. The first metal pattern structure 140 may be configured in a bridge-shaped pattern extending across the guard ring 120 from the electrode structure 110 of the main chip region MC to the moisture-proof ring 130 of the sealing region MS.

Also, the semiconductor device 300 according to an embodiment of the inventive concept may include a second metal pattern structure 150 configured in a bridge-shaped pattern extending in a direction crossing the sealing region MS from the moisture-proof ring 130 to the outermost portion of the sealing region MS.

The difficulty in designing a semiconductor manufacturing process while facilitating current movement through the first and second metal pattern structures 140 and 150 may be decreased by adjusting the numbers and widths of the first and second metal pattern structures 140 and 150. That is, by taking a diameter of the semiconductor substrate 101, the number of the moisture-proof ring 130, a height of the moisture-proof ring 130, a magnitude of flowing current, etc. into consideration, the numbers and widths of the first and second metal pattern structures 140 and 150 may be adjusted.

A first width 140W of the first metal pattern structure 140 and a second width 150W of the second metal pattern structure 150 may be substantially equal to each other. However, embodiments of the inventive concept are not limited thereto. One end of the first metal pattern structure 140 may be in contact with an inner side of an edge of the moisture-proof ring 130, and the other end of the first metal pattern structure 140 may be in contact with the electrode structure 110. Also, one end of the second metal pattern structure 150 may be in contact with an outer side of the edge of the moisture-proof ring 130, and the other end of the second metal pattern structure 150 may be arranged at the outermost portion of the sealing region MS. Here, the other end of the second metal pattern structure 150 may have the irregular fracture surface 150E.

In some embodiments, the moisture-proof ring 130 may be formed in a closed quadrangular shape having four edges, the first metal pattern structure 140 may be in contact with at least one of inner sides of the four edges constituting the moisture-proof ring 130, and the second metal pattern structure 150 may be in contact with at least one of outer sides of the four edges constituting the moisture-proof ring 130.

In some embodiments, the first metal pattern structure 140 may be connected to one of contacted inner side of the four edges by a plurality of lines. Also, the second metal pattern structure 150 may be formed in a plurality of patterns protruding from one of contacted outer side of the four edges.

In some embodiments, the first metal pattern structure 140 may include a first upper metal pattern structure connected to the upper metal wiring layer 133 of the moisture-proof ring 130 and a first lower metal pattern structure connected to the lower metal wiring layer 132. Similarly, the second metal pattern structure 150 may include a second upper metal pattern structure connected to the upper metal wiring layer 133 of the moisture-proof ring 130 and a second lower metal pattern structure connected to the lower metal wiring layer 132.

The arrangements and configurations of the first and second metal pattern structures 140 and 150 are substantially the same as those described above, and thus, for convenience of explanation, a further description thereof will not be repeated.

The semiconductor device 300 including the missing region 131M may be included in the wafer 30 in a process of forming the moisture-proof ring 130. This phenomenon may have an effect on the semiconductor device 300 adjacent to an edge portion 30E of the wafer 30. As such, charged particles may be accumulated in the upper metal wiring layer 133 of the moisture-proof ring 130 in the semiconductor device 300 including the missing region 131M. In this case, an arcing phenomenon may occur in the semiconductor device 300. That is, charged particles may accumulate in the upper metal wiring layer 133 in an ungrounded state (or in a floating state) and the arcing phenomenon may occur, which may thereby affect the integrated circuit device TR of the semiconductor device 300. As a result, a defect rate of the semiconductor device 300 may increase.

According to embodiments of the inventive concept, in the semiconductor device 300, and the first and second metal pattern structures 140 and 150 may be used as preliminary ground lines even when the semiconductor device 300 includes the missing region 131M. Accordingly, even when the moisture-proof ring 130 having the missing region 131M exists, an arcing phenomenon occurring from charged particles due to plasma may be prevented in advance. As a result, prevention of or a reduction in a defect rate of the semiconductor device 300 may be realized.

Since the semiconductor device 300 according to embodiments of the inventive concept may efficiently suppress a defect such as an arcing phenomenon, product productivity and product reliability may be improved.

Figures 17, 18:
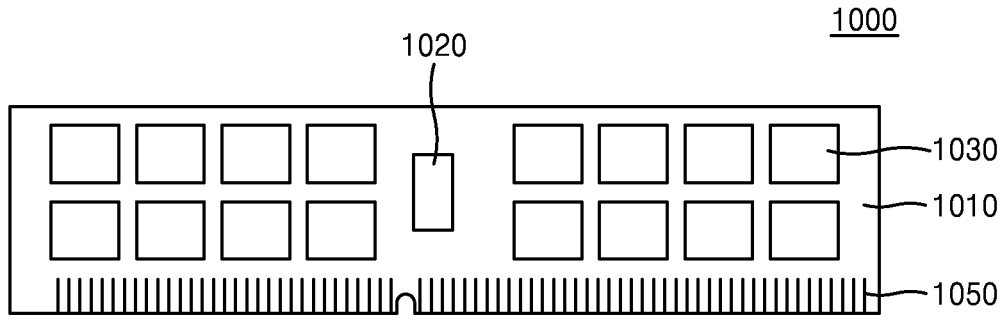
FIG. 17 is a plan view showing a semiconductor module including a semiconductor device, according to an embodiment of the inventive concept.
FIG. 18 is a block diagram showing a system of a semiconductor device, according to an embodiment of the inventive concept.

FIG. 17 is a plan view showing a semiconductor module including a semiconductor device, according to an embodiment of the inventive concept.

Referring to FIG. 17, a semiconductor module 1000 includes a module substrate 1010, a control chip 1020 mounted on the module substrate 1010, and a plurality of semiconductor devices 1030 mounted on the module substrate 1010.

A plurality of input/output terminals 1050, which may be inserted into sockets of a main board, are arranged on one side of the module substrate 1010. The plurality of semiconductor devices 1030 may include one of the semiconductor devices 100, 200, and 300 described above and modified embodiments thereof.

FIG. 18 is a block diagram showing a system of a semiconductor device, according to an embodiment of the inventive concept.

Referring to FIG. 18, a system 1100 includes a controller 1110, an input/output device 1120, a memory 1130, an interface 1140, and a bus 1150.

The system 1100 may be a mobile system or a system that transmits or receives information. In some embodiments, the mobile system may be, for example, a portable computer, a web tablet, a mobile phone, a digital music player, or a memory card.

The controller 1110 may control an execution program in the system 1100, and may include, for example, a microprocessor, a digital signal processor, a microcontroller, or other devices similar thereto.

The input/output device 1120 may be used to input to or output data from the system 1100. The system 1100 is connected to an external device, for example, a personal computer or a network, using the input/output device 1120, and may exchange data with the external device. The input/output device 1120 may be, for example, a touch pad, a keyboard, or a display.

The memory 1130 may store data for operation of the controller 1110, or may store data processed by the controller 1110. The memory 1130 may include one of semiconductor devices 100, 200, and 300 described above and modified embodiments thereof.

The interface 1140 may be a data transmission path between the system 1100 and an external device. The controller 1110, the input/output device 1120, the memory 1130, and the interface 1140 may communicate with each other through the bus 1150.

While the inventive concept has been particularly shown and described with reference to embodiments thereof, it will be understood that various changes in form and detail may be made therein without departing from the spirit and scope of the inventive concept as defined by the following claims.

What is claimed is:

1. A semiconductor device, comprising:

a semiconductor substrate comprising a main chip region;

an insulating layer disposed on the semiconductor substrate;

a guard ring surrounding the main chip region;

a moisture-proof ring surrounding the guard ring;

an electrode structure disposed in the main chip region and in contact with the semiconductor substrate in the main chip region; and at least one metal pattern structure extending from the electrode structure to the moisture-proof ring, wherein the at least one metal pattern structure includes a first sub metal pattern structure that connects the electrode structure to the guard ring and includes a second sub metal pattern structure that connects the guard ring to the moisture-proof ring, wherein the first and the second sub metal pattern structures are disposed to face each other, wherein the insulating layer is disposed between the at least one metal pattern structure and the semiconductor substrate, and wherein the at least one metal pattern structure is a connection line that grounds the moisture-proof ring.

2. The semiconductor device of claim 1, wherein the guard ring and the moisture-proof ring are disposed in a sealing region surrounding the main chip region, and wherein the first sub metal pattern structure extends across from the main chip region into the sealing region and connects the electrode structure to the guard ring.

3. The semiconductor device of claim 2, wherein the second sub metal pattern structure connects the guard ring to the moisture-proof ring is grounded to the semiconductor substrate via the guard ring using the at least one metal pattern structure as the connection line, or the moisture-proof ring is grounded to the semiconductor substrate via the electrode structure using the at least one metal pattern structure as the connection line in the sealing region.

4. The semiconductor device of claim 3, wherein each of the guard ring and the electrode structure is in direct contact with a doped region of the semiconductor substrate via a vertical via.

5. The semiconductor device of claim 1, wherein the at least one metal pattern structure comprises:

an upper metal pattern structure connected to an upper portion of the moisture-proof ring; and a lower metal pattern structure arranged below the upper metal pattern structure.

6. The semiconductor device of claim 5, wherein a level of an upper surface of the guard ring and a level of an upper surface of the moisture-proof ring are substantially equal to a level of an upper surface of the upper metal pattern structure.

7. The semiconductor device of claim 1, wherein, in a plan view, the moisture-proof ring is formed in a closed quadrangular shape having four edges, and the at least one metal pattern structure is in contact with at least one of the four edges constituting the moisture-proof ring.

8. The semiconductor device of claim 7, wherein the at least one metal pattern structure is connected to one of the four edges in contact with the at least one metal pattern structure by a plurality of lines.

* * * * *